US008970573B2

(12) United States Patent
Knausz et al.

(10) Patent No.: US 8,970,573 B2
(45) Date of Patent: Mar. 3, 2015

(54) VOLTAGE INTERPOLATING CIRCUIT

(75) Inventors: Imre Knausz, Fairport, NY (US); Clint Meyer, Rochester, NY (US)

(73) Assignee: Synaptics Incorporated, San Jose, CA (US)

( * ) Notice: Subject to any disclaimer, the term of this patent is extended or adjusted under 35 U.S.C. 154(b) by 290 days.

(21) Appl. No.: 13/535,050

(22) Filed: Jun. 27, 2012

(65) Prior Publication Data

US 2014/0002433 A1    Jan. 2, 2014

(51) Int. Cl.
*H03M 1/66*    (2006.01)
(52) U.S. Cl.
USPC .............................. 345/211; 341/144; 341/145
(58) Field of Classification Search
CPC ................ G09G 2310/027; G09G 2310/0289; G09G 2310/0294; G09G 5/00; H03M 1/661; H03M 1/76
See application file for complete search history.

(56) References Cited

U.S. PATENT DOCUMENTS

| | | | | |
|---|---|---|---|---|
| 5,642,117 | A * | 6/1997 | Luder et al. | 341/152 |
| 6,448,916 | B1 | 9/2002 | Leung | |
| 7,368,990 | B2 * | 5/2008 | Tsuchi | 330/261 |
| 8,111,184 | B2 * | 2/2012 | Tsuchi | 341/145 |
| 2004/0075633 | A1 * | 4/2004 | Yoshida | 345/98 |
| 2006/0109276 | A1 * | 5/2006 | Ooga et al. | 345/530 |
| 2006/0132193 | A1 * | 6/2006 | Tsuchi | 327/65 |
| 2006/0145965 | A1 * | 7/2006 | Choi et al. | 345/76 |
| 2008/0224972 | A1 * | 9/2008 | Nakajima et al. | 345/87 |
| 2011/0096054 | A1 | 4/2011 | Cho et al. | |
| 2011/0133783 | A1 | 6/2011 | Glass et al. | |
| 2011/0234571 | A1 * | 9/2011 | Tsuchi | 345/211 |
| 2012/0293483 | A1 * | 11/2012 | Ishii et al. | 345/212 |

OTHER PUBLICATIONS

Lee et al., 2009 IEEE International Solid-State Circuits Conference, "ISSCC 2009 / Session 15 / Display and Imager Electronics / 15.2". Samsung Electronics, Yongin, Korea.
Kang et al., 2007 IEEE International Solid-State Circuits Conference, "ISSCC 2007 / Session 7 / Display Electronics / 7.5". Samsung Electro-Mechanics, Suwon, Korea.
Lu et al., 2011 IEEE International Solid-State Circuits Conference, "ISSCC 2011 / Session 17 / Biomedical & Displays / 17.10". National Tsing Hua University, Hsinchu, Taiwan.

* cited by examiner

*Primary Examiner* — Claire X Pappas
*Assistant Examiner* — Richard Hong
(74) *Attorney, Agent, or Firm* — Patterson + Sheridan, LLP

(57) ABSTRACT

A display driver maps a selection code (a digital signal) to a reference voltage which is then used to produce a particular intensity of the radiation emitted from a pixel on a display screen (e.g., a LCD display). This mapping may be performed by one or more DACs in the display driver. However, instead of transmitting all of the different possible reference voltages to the DACs, only a subset of the reference voltages are transmitted. Each DAC may include an interpolator circuit that uses the received reference voltages to interpolate the reference voltages that were not transmitted. In this manner, the display driver may still provide the same number of unique reference voltages to a display screen while transmitting fewer reference voltages along the driver's optical channel.

20 Claims, 15 Drawing Sheets

| Code | Binary | ACTION | LOWER MUX ADDRESS | UPPER MUX ADDRESS | 2 LSB's | Decrement | DM 625A | DM 625B |
|---|---|---|---|---|---|---|---|---|
| 255 | 11111111 | Upper | 111111 | 111111 | 11 | 0 | 1 | 1 |
| 254 | 11111110 | Interp U-L | 111111 | 111111 | 10 | 0 | 0 | 1 |
| 253 | 11111101 | Lower | 111111 | 111111 | 01 | 0 | 0 | 0 |
| 252 | 11111100 | Interp L-U | 111111 | 111110 | 00 | 1 | 1 | 0 |
| 251 | 11111011 | Upper | 111110 | 111110 | 11 | 0 | 1 | 1 |
| 250 | 11111010 | Interp U-L | 111110 | 111110 | 10 | 0 | 0 | 1 |
| 249 | 11111001 | Lower | 111110 | 111101 | 01 | 0 | 0 | 0 |
| 248 | 11111000 | Interp L-U | 111110 | 111101 | 00 | 1 | 1 | 0 |
| 247 | 11110111 | Upper | 111101 | 111101 | 11 | 0 | 1 | 1 |
| 246 | 11110110 | Interp U-L | 111101 | 111101 | 10 | 0 | 0 | 1 |
| 245 | 11110101 | Lower | 111101 | 111100 | 01 | 0 | 0 | 0 |
| 244 | 11110100 | Interp L-U | 111100 | 111100 | 00 | 1 | 1 | 0 |
| 243 | 11110011 | Upper | 111100 | 111100 | 11 | 0 | 1 | 1 |
| 242 | 11110010 | Interp U-L | 111100 | 111100 | 10 | 0 | 0 | 1 |
| 241 | 11110001 | Lower | 111100 | 111100 | 01 | 0 | 0 | 0 |
| 240 | 11110000 | Interp L-U | 111100 | 111011 | 00 | 1 | 1 | 0 |

FIG. 6B

| Code | Binary | Action | LOWER MUX ADDRESS | UPPER MUX ADDRESS | 3 LSB's | Decrement | DM 725A | DM 725B | DM 725C | DM 725D |
|---|---|---|---|---|---|---|---|---|---|---|
| 255 | 11111111 | Upper | 11111 | 11111 | 111 | 0 | 1 | 1 | 1 | 1 |
| 254 | 11111110 | Interp U-L 3/4 | 11111 | 11111 | 110 | 0 | 0 | 1 | 1 | 1 |
| 253 | 11111101 | Interp U-L 2/4 | 11111 | 11111 | 101 | 0 | 0 | 0 | 1 | 1 |
| 252 | 11111100 | Interp U-L 1/4 | 11111 | 11111 | 100 | 0 | 0 | 0 | 0 | 1 |
| 251 | 11111011 | Lower | 11111 | 11110 | 011 | 1 | 0 | 0 | 0 | 0 |
| 250 | 11111010 | Interp L-U 3/4 | 11111 | 11110 | 010 | 1 | 0 | 0 | 0 | 1 |
| 249 | 11111001 | Interp L-U 2/4 | 11111 | 11110 | 001 | 1 | 0 | 0 | 1 | 1 |
| 248 | 11111000 | Interp L-U 1/4 | 11111 | 11110 | 000 | 0 | 0 | 1 | 1 | 1 |
| 247 | 11110111 | Upper | 11110 | 11110 | 111 | 0 | 1 | 1 | 1 | 1 |
| 246 | 11110110 | Interp U-L 3/4 | 11110 | 11110 | 110 | 0 | 0 | 1 | 1 | 1 |
| 245 | 11110101 | Interp U-L 2/4 | 11110 | 11110 | 101 | 0 | 0 | 0 | 1 | 1 |
| 244 | 11110100 | Interp U-L 1/4 | 11110 | 11110 | 100 | 0 | 0 | 0 | 0 | 1 |
| 243 | 11110011 | Lower | 11110 | 11101 | 011 | 1 | 0 | 0 | 0 | 0 |
| 242 | 11110010 | Interp L-U 3/4 | 11110 | 11101 | 010 | 1 | 0 | 0 | 0 | 1 |
| 241 | 11110001 | Interp L-U 2/4 | 11110 | 11101 | 001 | 1 | 0 | 0 | 1 | 1 |
| 240 | 11110000 | Interp L-U 1/4 | 11110 | 11101 | 000 | 1 | 0 | 1 | 1 | 1 |

FIG. 7C

| Code | Binary | Lower Mux Address | Upper Mux Address | Action | Lower Mux Address | Upper Mux Address | 2 LSB's | L.E. | U.E. | Decrement | Short |
|---|---|---|---|---|---|---|---|---|---|---|---|
| 255 | 11111111 | 111111 | 111111 | Upper | 111111 | 111111 | 11 | 0 | 1 | 0 | 1 |
| 254 | 11111110 | 111111 | 111111 | Interp U-L | 111111 | 111111 | 10 | 1 | 1 | 0 | 0 |
| 253 | 11111101 | 111111 | 111110 | Lower | 111111 | 111111 | 01 | 1 | 0 | 0 | 1 |
| 252 | 11111100 | 111111 | 111110 | Interp L-U | 111110 | 111110 | 00 | 1 | 1 | 1 | 0 |
| 251 | 11111011 | 111110 | 111111 | Upper | 111110 | 111110 | 11 | 0 | 1 | 0 | 1 |
| 250 | 11111010 | 111110 | 111111 | Interp U-L | 111110 | 111110 | 10 | 1 | 1 | 0 | 0 |
| 249 | 11111001 | 111110 | 111110 | Lower | 111101 | 111101 | 01 | 1 | 0 | 0 | 1 |
| 248 | 11111000 | 111110 | 111110 | Interp L-U | 111101 | 111101 | 00 | 1 | 1 | 1 | 0 |
| 247 | 11110111 | 111101 | 111101 | Upper | 111101 | 111101 | 11 | 0 | 1 | 0 | 1 |
| 246 | 11110110 | 111101 | 111101 | Interp U-L | 111101 | 111101 | 10 | 1 | 1 | 0 | 0 |
| 245 | 11110101 | 111101 | 111100 | Lower | 111101 | 111101 | 01 | 1 | 0 | 0 | 1 |
| 244 | 11110100 | 111101 | 111100 | Interp L-U | 111100 | 111100 | 00 | 1 | 1 | 1 | 0 |
| 243 | 11110011 | 111100 | 111101 | Upper | 111100 | 111100 | 11 | 0 | 1 | 0 | 1 |
| 242 | 11110010 | 111100 | 111101 | Interp U-L | 111100 | 111100 | 10 | 1 | 1 | 0 | 0 |
| 241 | 11110001 | 111100 | 111100 | Lower | 111100 | 111100 | 01 | 1 | 0 | 0 | 1 |
| 240 | 11110000 | 111100 | 111100 | Interp L-U | 111100 | 111011 | 00 | 1 | 1 | 1 | 0 |

FIG. 8B

VOLTAGE INTERPOLATING CIRCUIT

BACKGROUND OF THE INVENTION

1. Field of the Invention

This invention generally relates to digital to analog converters, and more specifically, to a converter that interpolates analog reference voltages.

2. Description of Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

In some electronic systems, the input devices are integrated with display screens for displaying information to a user of the system. The electronic systems may include a display driver for selecting reference voltages that determine the grey scale of the individual pixels of the display screen. Typically, the display driver receives or generates a digital data signal that is used by a digital to analog converter to output a specific analog reference voltage. This voltage is applied to a material of the display screen (e.g., liquid crystal) to aid in filtering polarized radiation.

BRIEF SUMMARY OF THE INVENTION

Embodiments presented in this disclosure include a circuit for providing an output voltage. The circuit includes a first selecting circuit configured to output a first voltage selected from a first plurality of input voltages based on a selecting code and a second selecting circuit configured to output a second voltage selected from a second plurality of input voltages based on the selecting code. The circuit also includes an analog decrementer circuit configured to selectively decrement the selecting code before the selecting code is provided to the second selecting circuit and an interpolating circuit coupled to respective outputs of the first and second selecting circuits. The interpolating circuit provides the output voltage based on the respective outputs such that the output voltage is selected from one of: the first voltage, the second voltage, and an interpolation voltage based on the first and second voltages.

Additional embodiments include a method for generating an output voltage. The method includes selecting, based on a selecting code, a first voltage from a first plurality of input voltages and a second voltage from a second plurality of input voltages. The method also includes selectively decrementing, using an analog decrementer circuit, the selecting code before the selecting code is used to select the second voltage. The method provides the output voltage based on the first and second voltages, where the output voltage is selected from one of: the first voltage, the second voltage, and an interpolation voltage based on the first and second voltages.

Additional embodiments include a system for providing an output voltage. The system comprises a display driver and a display screen configured to receive an output voltage from the display driver. The display driver includes a first selecting circuit configured to output a first voltage selected from a first plurality of input voltages based on a selecting code and a second selecting circuit configured to output a second voltage selected from a second plurality of input voltages based on the selecting code. The display driver also includes an analog decrementer circuit configured to selectively decrement the selecting code before the selecting code is provided to the second selecting circuit and an interpolating circuit coupled to respective outputs of the first and second selecting circuits. The interpolating circuit provides the output voltage based on the respective outputs, where the output voltage is selected from one of: the first voltage, the second voltage, and an interpolation voltage based on the first and second voltages.

BRIEF DESCRIPTION OF DRAWINGS

The preferred exemplary embodiment of the present invention will hereinafter be described in conjunction with the appended drawings, where like designations denote like elements.

FIGS. 6A-6B illustrate a schematic diagram of a DAC and a corresponding signal table, according to embodiments described herein.

FIGS. 7A-7C illustrate schematic diagrams of a DAC and a corresponding signal table, according to embodiments described herein.

FIGS. 8A-8B illustrate a schematic diagram of a DAC and a corresponding signal table, according to embodiments described herein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

A display driver converts a selection code (a digital signal) to a reference voltage which is then used to produce a particular intensity of the radiation emitted from a pixel on a display screen (e.g., a LCD display). As selection codes for display screens have increased, so has the complexity of the drivers. For example, reference voltages have increased from 64 voltage levels (addressable by a 6-bit selection code) to 256 voltage levels (addressable by an 8-bit selection code).

However, as display screen materials change, the number of selection codes, and thus, the number of reference voltages may also increase.

A display driver includes one or more digital to analog converters (DACs) that output the analog reference voltage corresponding to a particular selection code. Instead of routing all of the reference voltages across an optical channel of the display driver, the DACs may include an interpolator circuit for generating a superset of the reference voltages. Using interpolator circuits may reduce the number of reference voltage wires in the optical channel. For example, the DACs may need to receive only 128 or 64 reference voltages in order to output 256 unique voltage levels.

Figure 1:
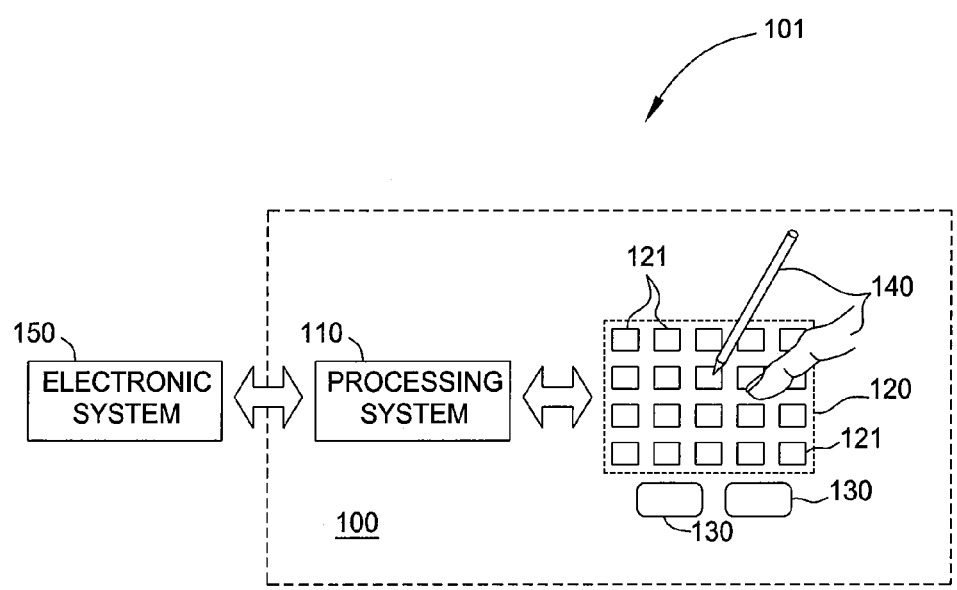
FIG. 1 is a schematic block diagram of an exemplary display device integrated with an input device, according to an embodiment described herein.

FIG. 1 is a block diagram of an exemplary display device 101 integrated with an input device 100, in accordance with an embodiment described herein. Although embodiments described herein may be utilized in a display device integrated with an input device, it is contemplated that the invention may be embodied in display devices without input devices. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system 150 could be a host or a slave to the input device.

The input device 100 can be implemented as a physical part of the electronic system 150, or can be physically separate from the electronic system 150. As appropriate, the input device 100 may communicate with parts of the electronic system 150 using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements 121 for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) 121 of the input device 100. In other embodiments, components of processing system 110 are physically separate with one or more components close to sensing element(s) 121 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) 121 to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system 150 (e.g. to a central processing system of the electronic system 150 that is separate from the processing system 110, if such a separate central processing system exists). In some embodiments, some part of the electronic system 150 processes information received from the processing system 110 to act on user input, such as to facilitate a full range of actions, including mode changing actions and GUI actions.

For example, in some embodiments, the processing system 110 operates the sensing element(s) 121 of the input device 100 to produce electrical signals indicative of input (or lack of input) in the sensing region 120. The processing system 110 may perform any appropriate amount of processing on the electrical signals in producing the information provided to the electronic system 150. For example, the processing system 110 may digitize analog electrical signals obtained from sensor electrodes associated with the sensing elements 121. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen of the display device 101. For example, the input device 100 may comprise substantially transparent sensor electrodes overlaying the display screen and provide a touch screen interface for the associated electronic system 150. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 101 may share physical elements. For example, some embodiments may utilize some of the same electrical components for displaying and sensing. As another example, the display device 101 may be operated in part or in total by the processing system 110.

It should be understood that while many embodiments described herein are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
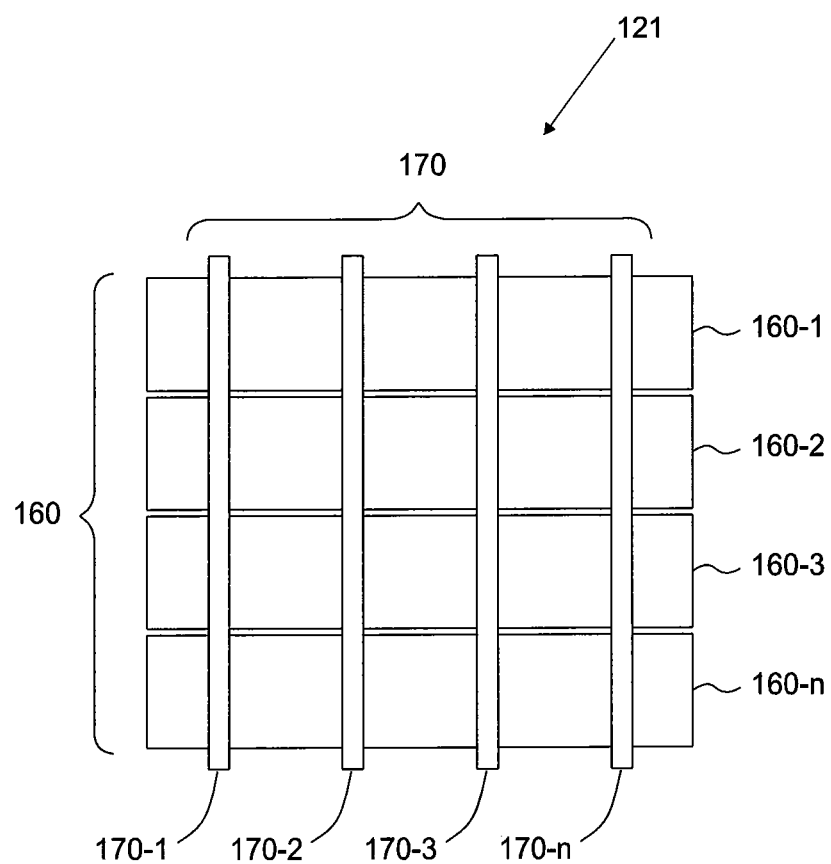
FIG. 2 illustrates a stack-up of a sensor assembly that may be used in the input device to sense the input object, according to an embodiment described herein.

FIG. 2 shows a portion of an exemplary pattern of sensing elements 121 configured to sense in a sensing region associated with the pattern, according to some embodiments. For clarity of illustration and description, FIG. 2 shows the sensing elements 121 as a pattern of simple rectangles, and does not show various components. This pattern of sensing elements 121 comprises a plurality of transmitter electrodes 160 (160-1, 160-2, 160-3, . . . 160-*n*), and a plurality of receiver electrodes 170 (170-1, 170-2, 170-3, . . . 170-*n*) disposed over the plurality of transmitter electrodes 160.

Transmitter electrodes 160 and receiver electrodes 170 are typically ohmically isolated from each other. That is, one or more insulators separate transmitter electrodes 160 and receiver electrodes 170 and prevent them from electrically shorting to each other. In some embodiments, transmitter electrodes 160 and receiver electrodes 170 are separated by insulative material disposed between them at cross-over areas; in such constructions, the transmitter electrodes 160 and/or receiver electrodes 170 may be formed with jumpers connecting different portions of the same electrode. In some embodiments, transmitter electrodes 160 and receiver electrodes 170 are separated by one or more layers of insulative material. In some other embodiments, transmitter electrodes 160 and receiver electrodes 170 are separated by one or more substrates; for example, they may be disposed on opposite sides of the same substrate, or on different substrates that are laminated together.

The areas of localized capacitive coupling between transmitter electrodes 160 and receiver electrodes 170 may be termed "capacitive pixels." The capacitive coupling between the transmitter electrodes 160 and receiver electrodes 170 change with the proximity and motion of input objects in the sensing region associated with the transmitter electrodes 160 and receiver electrodes 170.

In some embodiments, the sensor pattern is "scanned" to determine these capacitive couplings. That is, the transmitter electrodes 160 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 170 to be independently determined.

The receiver sensor electrodes 170 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some touch screen embodiments, transmitter electrodes 160 comprise one or more common electrodes (e.g., "V-com electrode") used in updating the display of the display screen. These common electrodes may be disposed on an appropriate display screen substrate. For example, the common electrodes may be disposed on the TFT glass in some display screens (e.g., In Plan Switching (IPS) or Plan to Line Switching (PLS)), on the bottom of the color filter glass of some display screens (e.g., Patterned Vertical Alignment (PVA) or Multi-domain Vertical Alignment (MVA)), etc. In such embodiments, the common electrode can also be referred to as a "combination electrode", since it performs multiple functions. In various embodiments, each transmitter electrode 160 comprises one or more common electrodes. In other embodiments, at least two transmitter electrodes 160 may share at least one common electrode.

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In some embodiments where the two rates differ, successive capacitive images are acquired at different display updating states, and the different display updating states may affect the capacitive images that are acquired. That is, display updating affects, in particular, the background capacitive image. Thus, if a first capacitive image is acquired when the display updating is at a first state, and a second capacitive image is acquired when the display updating is at a second state, the first and second capacitive images may differ due to differences in the background capacitive image associated with the display updating states, and not due to changes in the sensing region. This is more likely where the capacitive sensing and display updating electrodes are in close proximity to each other, or when they are shared (e.g. combination electrodes).

For convenience of explanation, a capacitive image that is taken during a particular display updating state is considered to be of a particular frame type. That is, a particular frame type is associated with a mapping of a particular capacitive sensing sequence with a particular display sequence. Thus, a first capacitive image taken during a first display updating state is considered to be of a first frame type, a second capacitive image taken during a second display updating state is considered to be of a second frame type, a third capacitive image taken during a first display updating state is considered to be of a third frame type, and so on. Where the relationship of display update state and capacitive image acquisition is periodic, capacitive images acquired cycle through the frame types and then repeats.

Figure 3:
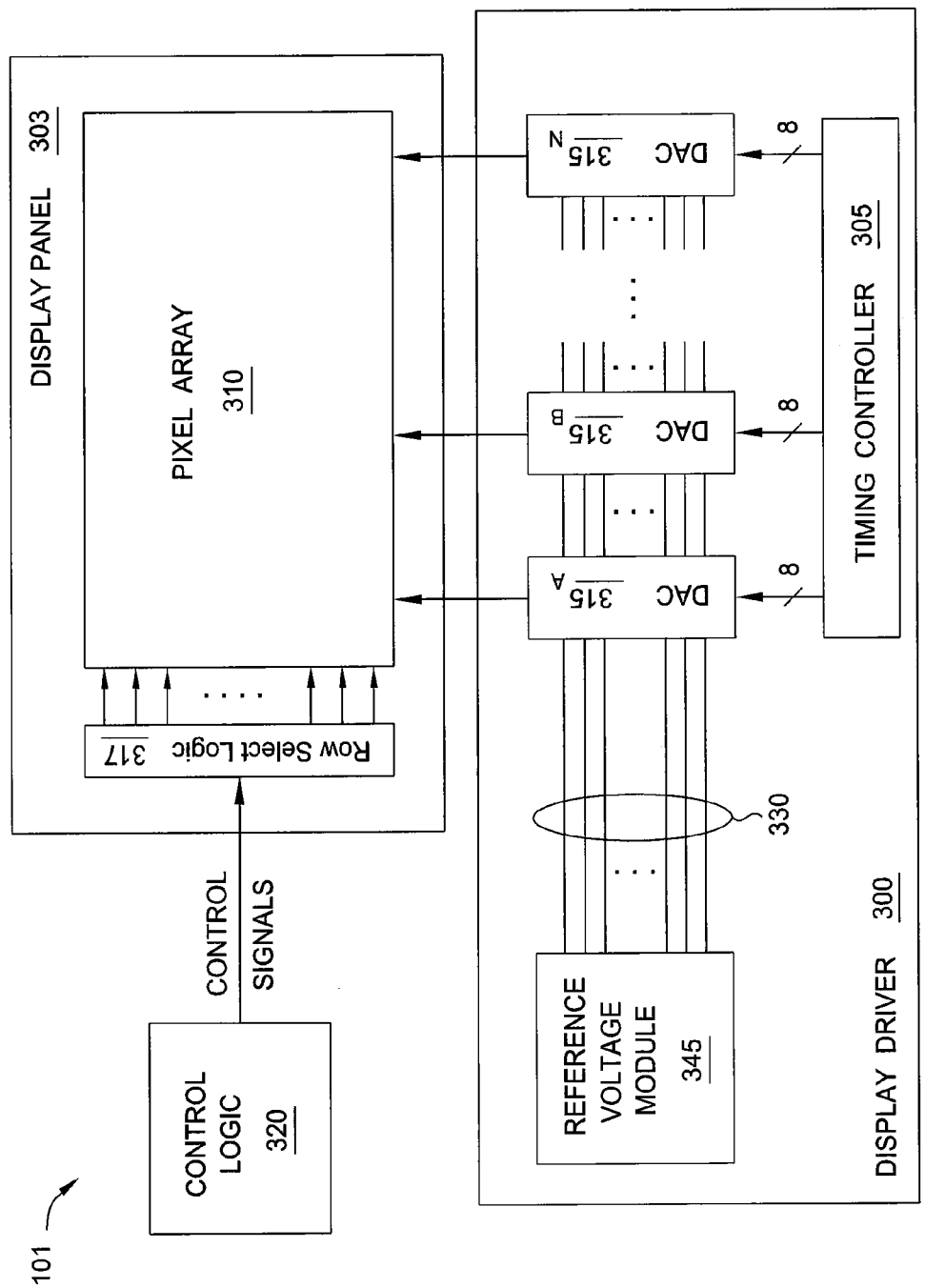
FIG. 3 illustrates the display device, according to an embodiment described herein.

FIG. 3 illustrates a block diagram of one example of the display device 101. In one embodiment, display panel 303 may use a thin film transistor liquid crystal display panel 303 that includes red, green and blue subpixels. As shown, display panel 303 includes pixel array 310 and row select logic 317. Control logic 320 provides control signals to row select logic 317 so that one row of pixel array 310 is selected. Also, control logic 320 may assert red, green, or blue select signals (not shown) which select the red sub-pixels, green sub-pixels, or blue sub-pixels of pixel array 310.

The display driver 300 includes a reference voltage module 345, the timing controller 305, and one or more DACs 315. The reference voltage module 345 provides a set of analog reference voltages on wires 330, where each voltage corresponds to one of a possible adjustment value (e.g., red adjustment values, green adjustment values, or blue adjustment values, or the like). The possible adjustment values are selected based on a selection code (also called a grey level code value) that is provided by the timing controller 305. As shown here, the selection code is an 8-bit grey level code value that selects one of the 256 different reference voltages 330. Because this correspondence may be different for red, green and blue, the reference voltage module 345 may generate a different set of reference voltages for each color which typically range from 0 V to 5 V. Accordingly, reference voltage module 345 may be controlled by a stored set of adjustment values (not shown) which provide voltage adjustment settings and tap settings that configure the reference voltage module 345 to output reference voltages that replicate, for example, a selected gamma curve associated with display panel 303 (i.e., a particular red, blue, or green gamma curve for display panel 210). In one embodiment, the reference voltage module 345 may include a resistor string, or alternatively, one or more multiplexers with corresponding operational amplifiers (or buffers) to generate the reference voltages. Nonetheless, the embodiments disclosed herein are not dependent on any particular manner of generating the reference voltages.

In one embodiment, for a given pixel, the associated DAC 315 ($315_A$, $315_B$, . . . $315_N$) connects exactly one of these voltages to the display panel 303 based on the digital selection code provided by the timing controller 305. In one embodiment, the DACs 315 may include a buffer amplifier that drives a buffered replica of the selected reference voltage onto the corresponding pixel. The DACs 315, buffer amplifiers, and the connection interface on the display driver 300 between the driver 300 and the display panel 303 may be referred to as the optical channel of the display driver 300.

In one embodiment, the reference voltage module 345 changes its output reference voltages 330 per selected sub-pixel color. For example, a reference voltage may be chosen once when the red sub-pixels columns are selected, again for the green sub-pixel column, and finally for the blue sub-pixel columns. In other embodiments, the reference voltage module 345 produces the same reference voltages for more than one sub-pixel color. Although times may vary per display panel, a typical line time for an 864 row×480 column 60 fps display is often no longer than $1/(864\times60)=19$ μs. In various embodiments, less than a third of this time is available for each color group of sub-pixels.

In one embodiment, the transmission of the selection codes from the timing controller 305 may be synchronized with the control signals of the control logic 320. Although control logic 320 is shown separately from timing controller 305, control logic 320 may be within timing controller 305, according to various embodiments. Furthermore, in one embodiment, the reference voltage module 345 and the timing controller 305 may not be located on the same IC chip as the display driver 300.

Figure 4:
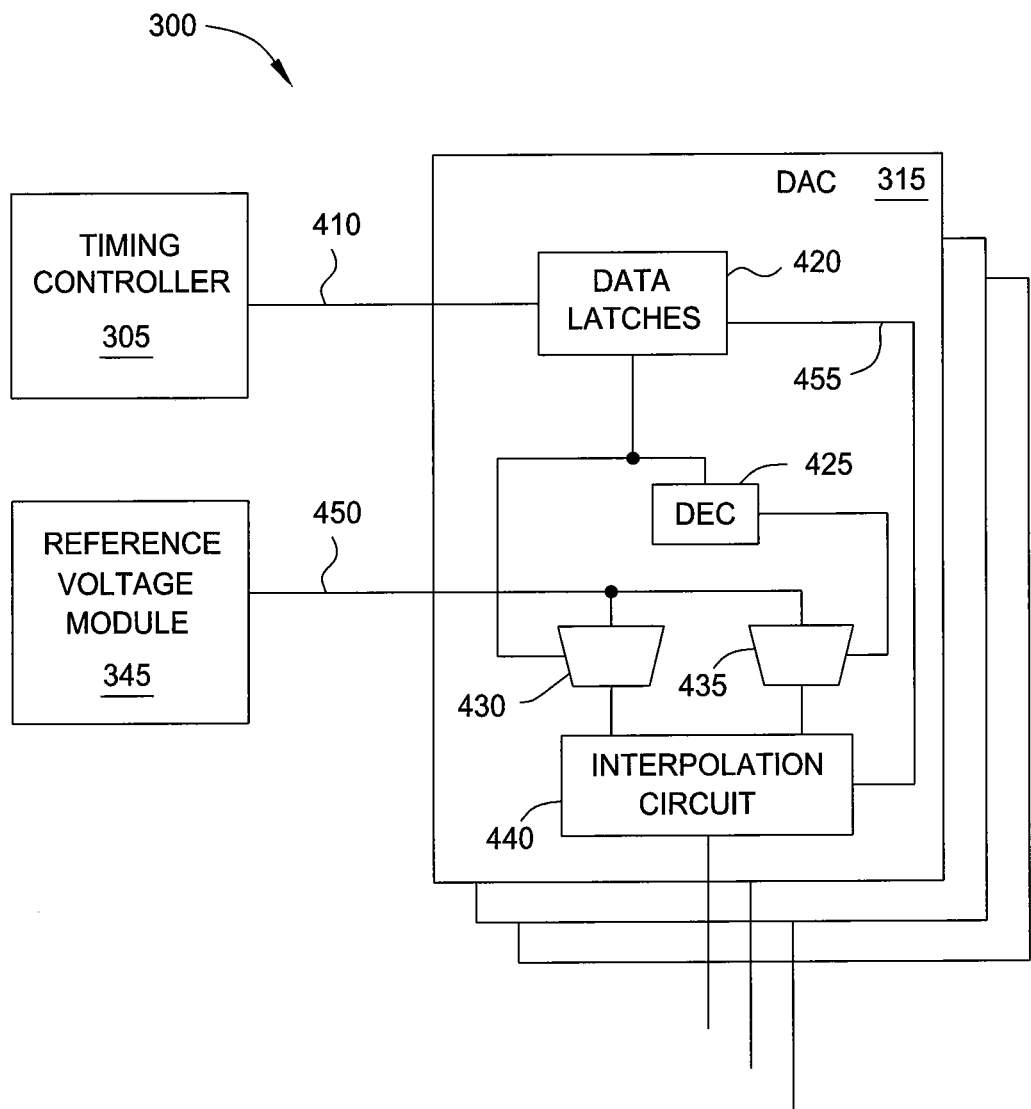
FIG. 4 is a schematic diagram illustrating one example of a digital to analog converter in a display driver, according to an embodiment described herein.

FIG. 4 is a schematic diagram illustrating one example of a DAC 315 in a display driver 300. As shown, the display driver 300 includes the timing controller 305 and reference voltage module 345. As discussed above, the timing controller may provide a digital selection code along bus 410 that corresponds to a particular analog reference voltage outputted by the reference voltage module 345. The DAC 315 decodes the selection code and outputs the corresponding reference voltage to a display screen. For example, an 8-bit selection code corresponds up to 256 unique analog reference voltages.

The DAC 315 stores the received selection code in the data latches 420 which propagate the selection code throughout the rest of the DAC 315. The data latches 420 may be a plurality of flip-flops, registers, or other suitable storage element. The latches 420 transmit at least a portion of the selection code to selector circuits—e.g., the lower multiplexer (hereinafter "mux") 430 and the upper mux 435. The lower and upper muxes 430, 435 use the selection code to select a particular reference voltage to output. In the embodiment shown, before reaching the upper mux 435, a portion of the selection code may be decremented by the decrementer circuit 425. Specifically, the value of the signal received by the decrementer circuit 425 can be reduced by one.

In one embodiment, the entire selection code may not be received at the lower and upper muxes 430, 435. Instead, only a portion of the selection code is used as the selection signal—e.g., only the first six most significant bits (MSBs) of an 8-bit selection code. The decrementer circuit 425 may, for example, reduce the value of the MSB portion of the selection code to ensure the upper mux 435 selects the correct reference voltage from the reference voltage module 345. This process will be discussed in further detail below.

Using the selection code, the lower and upper muxes 430, 435 select a reference voltage from the bus 450. Although a single wire is shown, the bus 450 may include, for example, 129 or 65 individual wires on which the reference voltage module 345 drives 129 or 65 voltages, respectively. In one embodiment, each of the voltages is unique and may be used in a gamma reference system that includes the display panel 303 and display driver 300 shown in FIG. 3. Moreover, the DAC 315 (or a portion thereof) may be arranged in the IC chip of the display driver 300 such that the components of the DAC 315 are fabricated on a surface (or surfaces) of the chip that is below a surface that routes the bus 450. For example, in one embodiment, lower and upper muxes 430, 435 may be sized to fit within the width of the bus 450. Accordingly, if the number of wires in the bus 450 is decreased, designing DACs 315 or lower and upper muxes 430, 435 that fit within the decreased width of the bus 450 may save surface area on the display driver 300 that can be used by, for example, other modules. As a result, the size of the circuitry can be reduced requiring less die area to implement the smaller circuitry. Furthermore, reducing the wires of the bus 450 (e.g., from 256 to 129 wires) may also save power by reducing the number of reference voltages that the reference voltage module 345 drives along the length of the display driver's output channel including DACs 315.

The lower and upper muxes 430, 435 select two reference voltages based on the selection code and transmit the reference voltages to the interpolation circuit 440. Data path 455 may route a least significant bit (LSBs) portion of the selection code to decode logic in the interpolation circuit 440 that determines how to handle the reference voltages selected by the muxes 430, 435. Specifically, the interpolation circuit 440 selectively outputs (i) the reference voltage received from the lower mux 430, (ii) the reference voltage received from the upper mux 435, or (iii) an interpolated voltage that is based on weighting the two output reference voltages of the muxes 430, 435. The selected output voltage may then be transmitted to the electrodes of a display panel.

Although not shown, the LSB portion of the selection code may also be used as an enable signal to determine whether to use the decrementer circuit 425 to reduce the value of the selector signal for upper mux 435.

In one embodiment, the display driver 300 may include DACs 315 for performing dot inversion (i.e., pixel inversion), column inversion, line inversion, and the like. For example, each DAC 315 may have a corresponding "shadow DAC" in the optical channel that produces a similar output voltage based on a received selection code except that the selected output voltages are negative. These shadow DACs may have similar components as DAC 315 but connect to an inverse voltage reference module that provides negative reference voltages. The display driver 300 may use a swap mux (not shown) to choose which output of the two DACs to provide to the display screen based on the inversion scheme.

Figure 5:
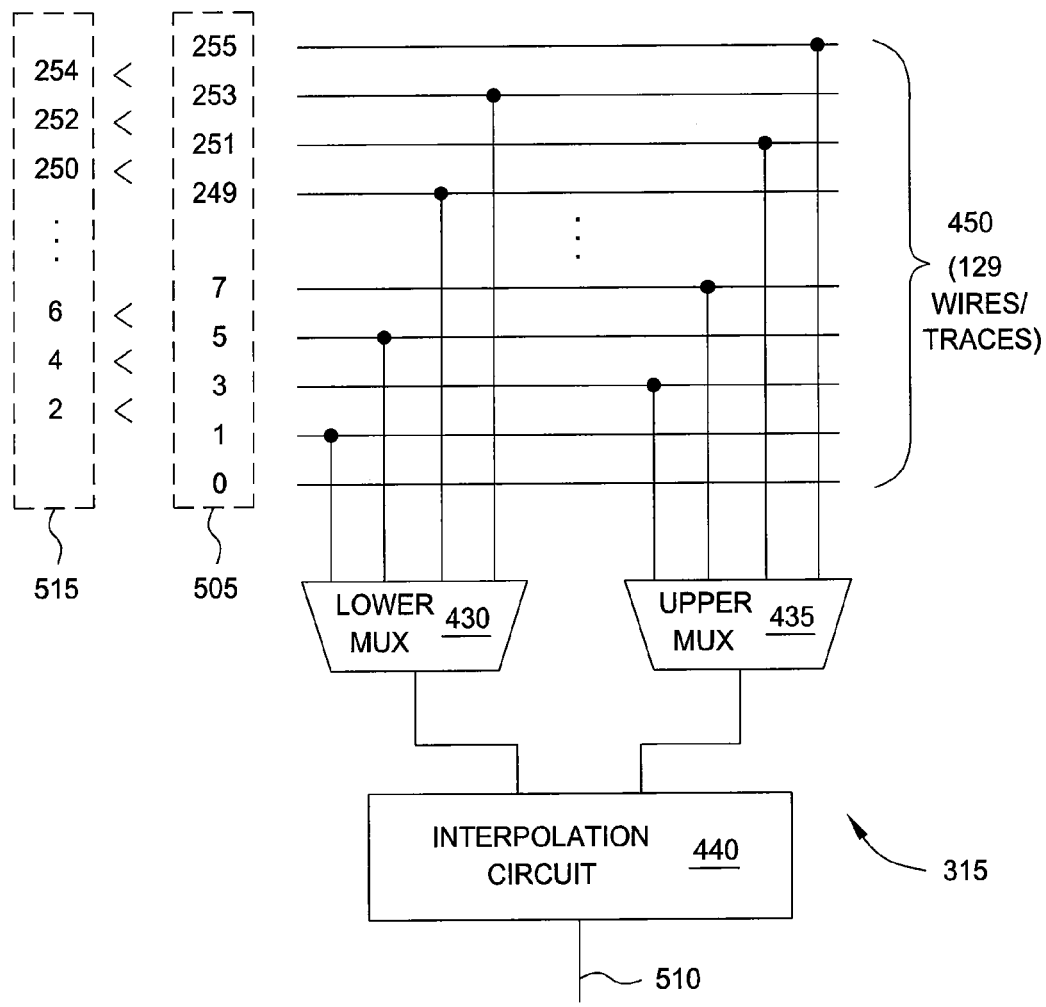
FIG. 5 is a schematic diagram of selector circuits connected to reference voltages, according to an embodiment described herein.

FIG. 5 is a schematic diagram of selector circuits connected to reference voltages, according to an embodiment described herein. Specifically, FIG. 5 illustrates a more detailed schematic view of connecting the upper and lower muxes 430, 435 to the bus 450. In the embodiment shown, the bus comprises of 129 wires that each provide a reference voltage. However, the input device may be configured to provide an 8-bit selection code from the timing controller that is capable of individually selecting (i.e., addressing) 256 reference voltages. Accordingly, the DAC 315 may interpolate the other 128 reference voltages from 129 reference voltages provided from the bus. Stated differently, the DAC 315 may be configured to output 256 different reference voltages even though the DAC 315 receives less than 256 voltages from the reference voltage module 345.

The number group 505 includes selection codes that are positioned next to the wires on the bus 450 they map to. As shown, selection code "0" maps to the bottom-most wire in the bus 450 followed by all the odd selection codes from "1" to "255" (the top-most wire in the bus 450) which results in a bus 450 with 129 wires. In one embodiment, all the reference voltages increase as the selection codes increase—i.e., selection code "255" corresponds to a higher reference voltage value than selection code "253", and "253" corresponds to a higher reference voltage than selection code "251". Or all the reference voltages may decrease as the selection codes increase. Nonetheless, the reference voltages need not change linearly—e.g., the reference voltages may produce a curved line when plotted. For example, some gamma reference systems use non-linear reference voltages in LCD display screens.

Referring to FIG. 4, when the binary representation of selection code "255" is transmitted to DAC 315, the upper mux 435 passes the reference voltage on the top-most wire to the interpolation circuit 440 which is then configured to pass the reference voltage to the display screen via path 510. If the selection code "254" is received by the DAC, because neither the lower mux 430 nor the upper mux 435 is connected to a wire of the bus 450 carrying a reference voltage corresponding to selection code "254", the corresponding reference voltage is interpolated. Specifically, the upper mux 435 may select the reference voltage corresponding to selection code "255" while the lower mux 430 selects the reference voltage corresponding to selection code "253". The interpolation circuit 440 may then receive both of these reference voltages and output an interpolated voltage (i.e., an average) of the two reference voltages. Thus, the display driver can provide 8-bit resolution using only half the number of wires in the bus 450. The box 515 contains selection codes corresponding to reference voltages that may be interpolated from the reference voltages transmitted on bus 450. That is the reference voltage corresponding to selection code "6" is derived from the reference voltages corresponding to selection codes "7" and "5", and so forth. However, it is not necessary to use the most immediate reference voltages to interpolate an output voltage. For example, the interpolation circuit 440 may use the reference voltages corresponding to selection codes "9" and "3" to interpolate the reference voltage correspond to selection code "6". Nonetheless, the upper and lower muxes 430, 435 may be connected to reference voltages that are interleaved in the manner shown.

In FIG. 5, the lower and upper mux 430 and 435 are 64-to-1 muxes. Thus, the muxes 430, 435 do not have enough inputs to address or interpolate all 256 different reference voltages. As shown, neither mux 430 nor mux 435 is connected to the wire bus corresponding to selection code "0"—i.e., the 129$^{th}$ wire of the bus. Accordingly, the DAC 315 may include circuitry or logic for detecting the special-case when selection code "0" is received from the timing controller 305 but is unable to be interpolated by the lower and upper muxes 430, 435. For example, the DAC 315 may include a separate wire that couples the bottom-most wire directly to the interpolation circuit 440 and bypasses the muxes 430, 435. This electrical path may be controlled such that the path is disconnected from the interpolation circuit 440 until the selection code "0" is received. Note that the any one of the wires, not just the bottom-most wire, may be treated as a special-case scenario. Further still, in another embodiment, a plurality of wires of bus 450, instead of only one wire, may be connected to special detection circuitry rather than connected to the muxes 430, 435. Moreover, the special detection circuitry may not be necessary if selection circuits with enough inputs to directly address or interpolate the 256 reference voltages are used.

Of course, the terms topmost and bottommost are for illustrative purposes only and are not intended to limit this disclosure. The wires of bus 450 may be arranged or routed in any manner on the display driver 300.

Figure 6A:
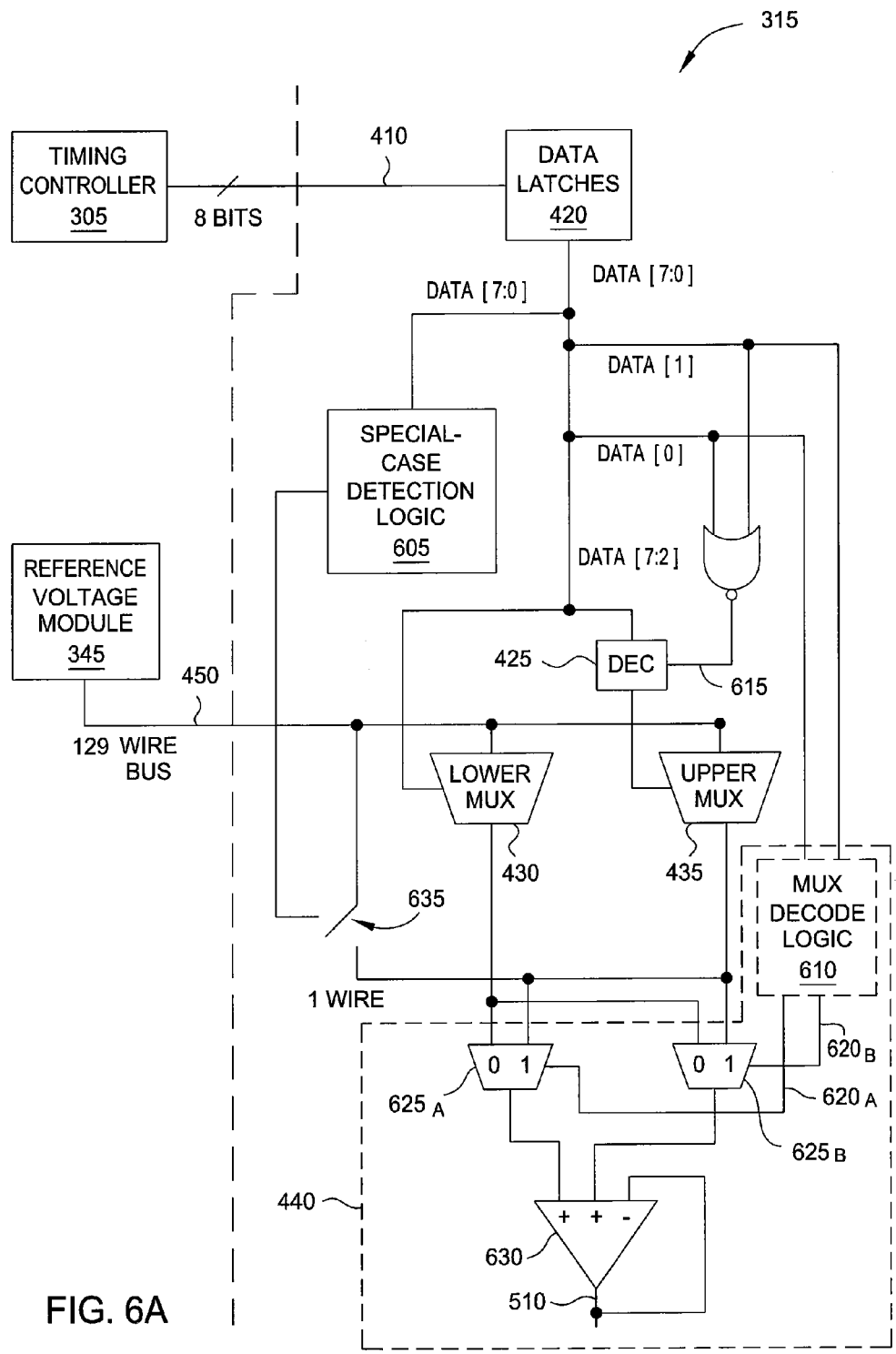

FIGS. 6A-6B illustrate a schematic diagram of a DAC and a corresponding signal table, according to embodiments described herein. Specifically, FIG. 6A is a more detailed schematic view of DAC 315 in FIGS. 3 and 4. The bus 410 transmits an 8-bit selection code from the timing controller 305 to the data latches 420 which then relays the selection code to the different components in the DAC 315. As shown, all 8 bits of the code are transmitted to the special-case detection logic 605 while only the 6 MSBs of the selection code are transmitted to the decrementer circuit 425, lower mux 430, and upper mux 435. The 2 LSBs are transmitted to the mux decode logic 610 and to the NOR gate that generates the enable signal 615 for the decrementer circuit 425. Although not shown, the DAC 315 may include a plurality of level shifters coupled to the data lines to change the low voltage data signals (e.g., ~1.5V) to a high voltage signal (e.g., ~6V). These higher voltage data signals may be necessary if high voltage analog components are used for the decrementer circuit 425, muxes 430, 435, and mux decode logic 610.

The 6 MSBs of the selection code are used by the lower and upper muxes 430, 435 to select an analog reference voltage from the bus 450. In this embodiment, the bus 450 includes 129 wires from which the DAC may derive and output up to 256 unique reference voltages. In one embodiment, these wires are charged with reference voltages that correspond to the odd selection codes 1-255 and 0 as shown in FIG. 5. If 64-to-1 muxes are used, each of the lower and upper muxes 430, 435 is connected to 64 of the 129 wires and may be connected in the manner shown in FIG. 5.

The decrementer circuit 425 may decrement the value of the 6 MSB portion of the selection code by one when the decrement enable signal 615 is high. When the decrementer circuit 425 is enabled, the upper mux 435 receives a selector signal that differs by a value of one from the selector signal received by the lower mux 430. Based on these selector signals, the muxes 430, 435 output respective reference voltages. The decode muxes (DM) $625_{A-B}$ receive the respective reference voltages and determine, based on the signals generated by mux decode logic 610, if the reference voltage of the lower mux 430, the reference voltage of the upper mux 435, or both reference voltages are passed to the interpolator operational amplifier (hereinafter "op amp") 630. For example, if the mux decode logic 610 outputs a 0 for control signal $620_A$ and a 1 for control signal $620_B$, DM $625_A$ transmits the reference voltage outputted from lower mux 430 while DM $625_B$ transmits the reference voltage outputted from upper mux 435. The interpolator op amp 630 weights the two voltages and outputs the sum of the weighted voltages. Stated differently, the interpolator op amp 630 takes the average of the input voltages. If the signals $620_{A-B}$ are the same, then the DMs $625_{A-B}$ output the same reference voltage that is provided by one of the muxes 430, 435. If the same reference voltage is received at both positive inputs of the interpolator op amp 630, than the average of the voltages is merely the same reference voltage that was received at the inputs of the interpolator op amp 630. More detailed examples will be provided in the discussion accompanying FIG. 6B.

The special-case detection logic 605 may be configured to detect one or more selection codes that the lower and upper muxes 430, 435 are unable to handle. For example, as discussed previously, the muxes 430, 435 may not have enough inputs to connect to or interpolate all the reference voltages addressable by the selection code. Instead, the DAC 315 includes special-case detection logic 605 that determines whether the currently received selection code is a special-case scenario. If so, the logic 605 enables the switch 635 which electrically connects one wire of the bus 450 to the interpolator circuit 440. For example, if the special-case detection logic 605 is configured to detect a selection code of "0", then the switch 635 is connected to the individual wire in bus 450 that contains the reference voltage corresponding to selection code "0". This reference voltage is permitted to bypass the lower and upper muxes 430, 435. The mux decode logic 610 then controls the DMs $625_{A-B}$ to output the reference voltage to both positive inputs of the interpolating op amp 630. In one embodiment, the mux decode logic 610 may include a separate control signal (not shown) connected to the upper mux 435 to disable the mux 435 when switch 635 is closed.

Although shown as separate circuit modules for the sake of clarity, the special-case detection logic 605, switch 635, and lower mux 430 (or upper mux 435) may be integrated into a single logical component that performs the functions discussed above. Moreover, the special-case detection logic 605 may be used to detect several selection codes or even be omitted if different muxes 430, 435 are used that have enough inputs to generate the reference voltages needed for outputting 256 unique reference voltages. Alternatively, the special-case detection logic 605 and switch 635 may also be omitted if the special selection code (e.g., selection code "0") is simply ignored. For example, the DAC 315 may be configured to output the reference voltage corresponding to selection code "1" (or a similar reference voltage). This embodiment may save space on the display drive by eliminating the logic 605, switch 635, and one wire from the bus 450 although this may reduce the number of unique reference voltages that can be outputted by the DAC 315.

FIG. 6B is a table 650 that illustrates a portion of the logic and signal values in the DAC 315 based on a received selection code. The Code Column of table 650 illustrates selection codes 255-240 while the Binary Column lists the binary representation of these selection codes. The Action Column defines which reference voltage is output from the DAC 315. "Upper" indicates that the reference voltage of the upper mux 435 is outputted from the DAC 315, "lower" indicates that the reference voltage of the lower mux 430 is outputted, and "Interp U-L/Interp L-U"(Interpolate Upper-Lower/Lower-Upper) indicate that the DAC 315 interpolates a reference voltage based on the reference voltages outputted from the lower and upper muxes 430, 435. The Interp U-L and Interp L-U actions are distinguished by the selector signal for the upper mux 435 being decremented when the Interp L-U is the selected action.

The Lower Mux Address and Upper Mux Address Columns list the 6 MSBs of the selection code that is used as the selector signals for the lower and upper muxes 430, 435. These columns differ because the Upper Mux Addresses may be altered by the decrementer circuit 425. As shown, the values in the two columns are the same except for selection codes 252, 248, 244, and 240. The address defined in these columns is then used by the respective muxes 430, 435 to output one of the reference voltages transmitted by the bus 450. That is, the 64-1 muxes use the 6-bit selector signal (i.e., the 6 MSBs of the selection code) to address 64 ($2^6$) of the 129 wires of the bus 450, respectively.

The 2 LSB Column illustrates the two LSBs of the binary representation of the selection code as shown in the Binary Column. As discussed in FIG. 6A, the two LSBs may be used to generate both the enable signal 615 for the decrementer circuit 425 as well as the control signals used as selector signals for the DMs $625_{A-B}$. The Decrement Column illustrates the logic of the NOR gate in FIG. 6A; if the two LSBs are both zero, the decrement enable signal 615 goes high and the decrementer circuit 425 reduces the value of the upper mux's selector signal by a value of one.

The DM $625_A$ Column and the DM $625_B$ Column illustrate which respective input of the DMs is active. For example, a logical 1 indicates that a DM 625 transmits the reference voltage from upper mux 435 (or the wire of the bus 450 connected to switch 635) to the interpolator op amp 630 while a logical 0 indicates that the respective DM 625 transmits the reference voltage from lower mux 430 to the interpolator op amp 630. Accordingly, the mux decode logic 610 may be comprised of any combination of circuitry that results in the DM control signals shown in these columns.

In one example, if the selection code received by the DAC 315 is "255", the 6 MSB selector signal causes the lower mux 430 to output the reference voltage associated with selection code "253" while the upper mux 435 outputs the reference voltage associated with selection code "255". The mux decode logic 610 instructs both DMs $625_{A-B}$ to output the reference voltage associated with the upper mux 435. That is, the reference voltage output corresponding to selection code "253" from the lower mux 430 is ignored. Because both inputs to the interpolator op amp 630 are the same, the output from the DAC 315 is the reference voltage corresponding to selection code "255". Outputting selection code "253" works in a similar manner except that both DMs $625_{A-B}$ transmit to the interpolator op amp 630 the reference voltage outputted by the lower mux 430.

In another example, assume the DAC 315 receives selection code "254" from the timing controller 305. Again, the lower mux 430 outputs the reference voltage corresponding to selection code "253" while the upper mux 435 outputs the reference voltage corresponding to selection code "255". The mux decode logic 610 uses the two LSBs to determine that the reference voltages should be interpolated. Accordingly, DM $625_A$ transmits the output of the lower mux 430 to the interpolator op amp 630 while DM $625_B$ transmits the output of the upper mux 435. Notably, the same result may be achieved if the DM control signals are reversed such that DM $625_A$ transmits the output of the upper mux 435 while DM $625_B$ transmits the output of the lower mux 430. The interpolator op amp 630 averages the signals to output a reference voltage corresponding to selection code "254". In this manner, the DAC 315 does not need 256 individual reference wires from the reference voltage module 345 in order to provide the unique reference voltages.

In another example, assume the DAC 315 receives selection code "252" from the timing controller 305. Here, if the selector signal sent to the upper mux 435 was not decremented, than DAC 315 would output an interpolated reference voltage corresponding to selection code "254". Accordingly, the NOR gate instructs the decrementer circuit 425 to reduce the 6 MSB portion of the selection code sent to the upper mux 435 by a value of one—i.e., from "111111" to "111110". As a result, the lower mux 430 outputs the reference voltage corresponding to selection code "253" while the upper mux 435 outputs the reference voltage correspond to selection code "251". The mux decode logic 610 instructs DM $625_A$ to select the output of upper mux 435 and DM $625_B$ to select the output of the lower mux 430 (or vice versa). The interpolator op amp 630 averages the two different reference voltages and produces the interpolated reference voltage for selection code "252". Thus, the Interp U-L and Interp L-U actions are similar except that during the Interp L-U action the selector signal for the upper mux 435 is decremented.

If the special-case detection logic 605 determines that the DAC 315 receives the special selection code (e.g., selection code "0"), the logic 605 closes the switch 635 which electrically couples the wire of the bus 450 corresponding to the special selection code to the DMs $625_{A-B}$. Although not shown in Table 650, the mux decode logic 610 causes the DMs $625_{A-B}$ to both pass the reference voltage to the interpolator op amp 630. In one embodiment, the DAC 315 may disable one or both of the muxes 430, 435 when the special selection code is received. Thus, if the muxes 430, 435 are unable to generate all 256 reference voltages, the DAC 315 includes bypass circuitry for handling and generating special reference voltages. According to various embodiments, all or part of special-case detection logic 605 may be included within lower and/or upper mux 430, 435 and may comprise analog circuitry.

Figure 7A:
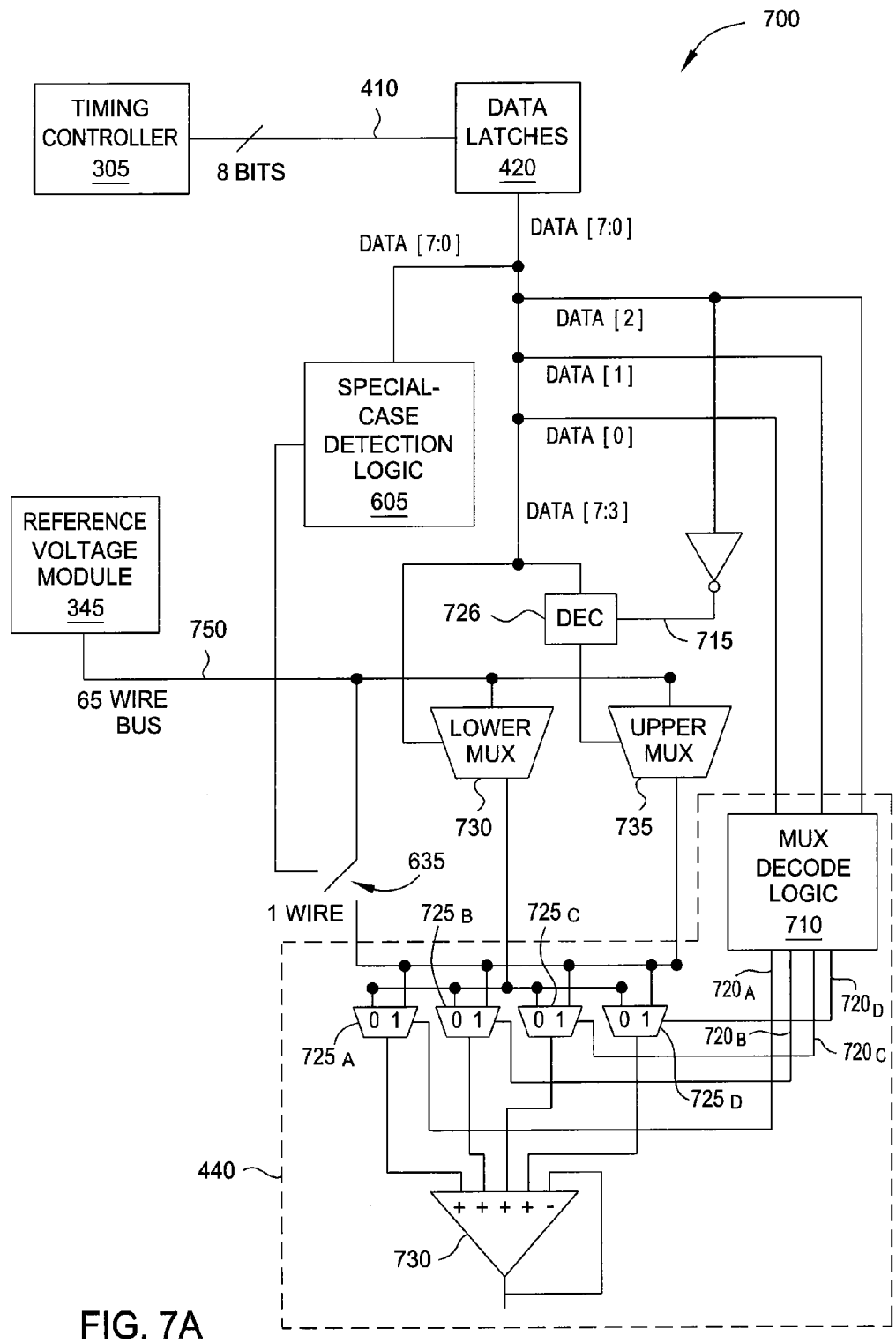
Figure 7B:
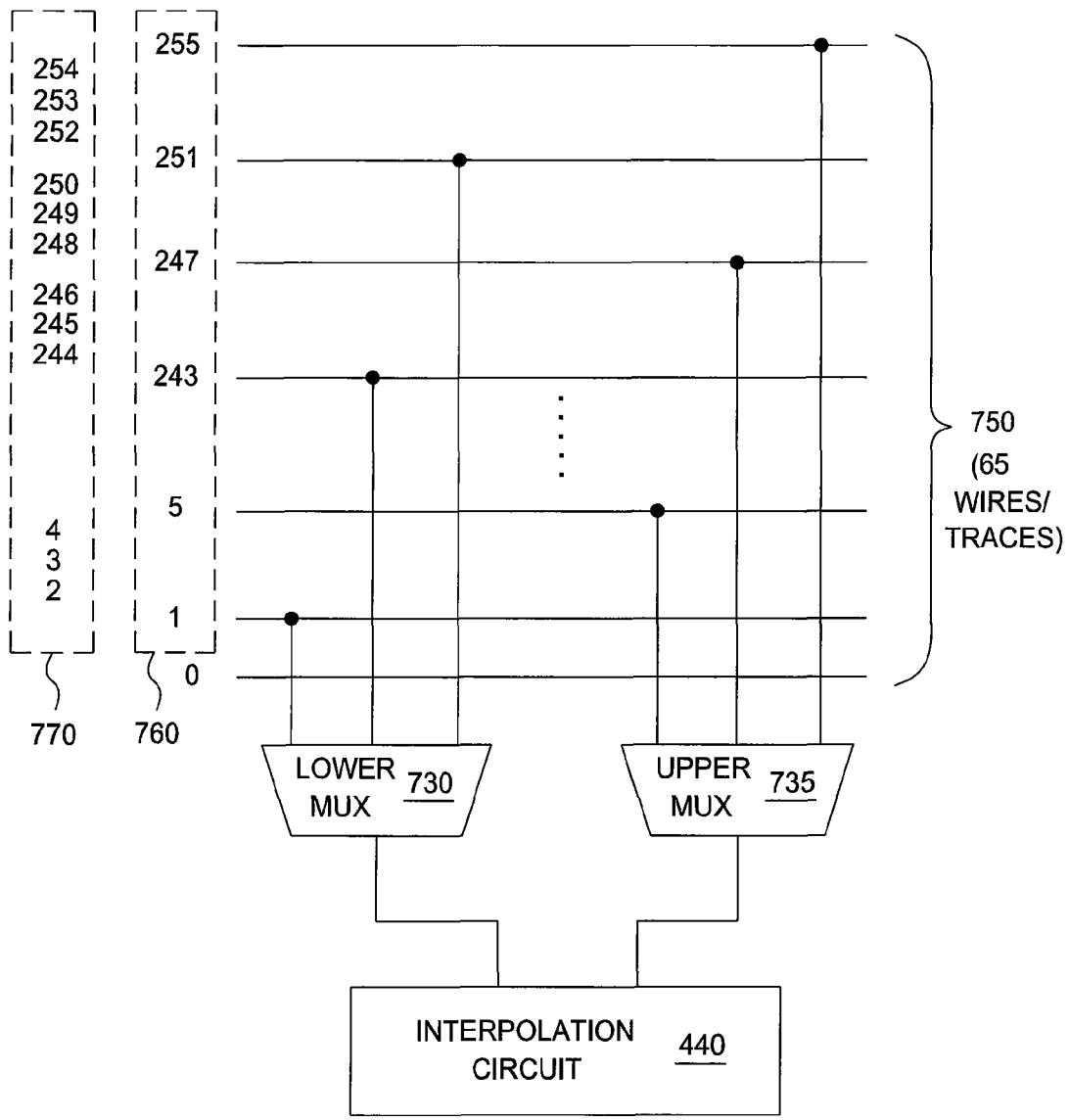

FIGS. 7A-7C illustrate schematic diagrams of a DAC and a corresponding signal table. The DAC 700 differs from the DAC 315 in FIG. 6A by using a 65 wire bus 750 to transmit the reference voltages from the reference voltage module 345. Nonetheless, the DAC 700 is also able to generate 256 unique reference voltages that may be used in a display screen. Here, the selector signals for the upper mux 735 and lower mux 730 are the 5 MSBs of the selection code received by the timing controller 305 which permits each mux 730, 735 to select up to half of the wires of the bus ($2^5$=32). Moreover, the mux decode logic 710 uses the 3 LSBs of the selection code for controlling the DMs 725$_{A-D}$. The interpolator op amp 730 weights each of its inputs connected to the outputs of the DMs 725$_{A-D}$. For example, each input of the interpolator op amp 730 contributes one fourth of the output signal of the amp 730. In one embodiment, two reference voltages may be used to generate up to five unique reference voltages, three of which are interpolated by weighting the signals.

As shown by FIG. 7B, the muxes 730, 735 are connected to the 65-wire bus 750 in a different manner than shown in FIG. 5. Instead of connecting the upper mux to the wires corresponding to selection codes "255", "251, "247" and so forth, the upper mux 735 is connected to 32 of the wires of bus 750 corresponding to selection codes "255", 247", "239", etc. Similarly, the lower mux 730 is also connected to 32 of the wires of bus 750 corresponding to selection codes "251", "243", "235", etc. Thus, the muxes 730, 735 may be selectively controlled to provide the reference voltages that correspond to the selection codes in group 760. The interpolator circuit 440 may be used to derive the reference voltages corresponding to the selection codes that are not electrically connected to the muxes 730, 735—i.e., the reference codes in group 770. For example, when the upper mux 735 selects the reference voltage associated with selection code "255" and the lower mux 730 selects the reference voltage associated with selection code "251", the interpolation circuit 440 can interpolate the reference voltages for selection codes "254", "253", and "252".

Returning to FIG. 7A, the decrementer circuit 726 performs a similar function as the decrementer circuit 425 in FIG. 6A except here the decrementer 726 reduces by a value of one the 5 MSBs of the selection code rather than the 6 MSBs—i.e., "11111" to "11110". Moreover, the decrementer enable signal 715 is controlled by the inverter coupled to a trace that transmits data[2] (the third LSB) of the selection code.

The table 790 of FIG. 7C illustrates a portion of the logic and signal values in the DAC 700 based on a received selection code. The columns are similar to the columns discuss in FIG. 6B except that the Action Column includes Interp U-L (L-U) 3/4, Interp U-L (L-U) 2/4, and Interp U-L (L-U) 1/4 which illustrate weighting the different inputs of the op amp 730 to provide the desired interpolated reference voltage. Moreover, table 790 includes two additional columns for the two additional DMs 725$_{C-D}$. The mux decode logic 710 may be implemented by any combination of circuitry that results in the DM control signals shown in the DM 725$_{A-D}$ Columns.

In one example, when the DAC 700 receives the selection code "255" (i.e., a Upper Action), the 5 MSBs instruct the upper mux 735 to select the reference voltage corresponding to selection code "255" and the lower mux 730 to select the reference voltage corresponding to selection code "251". The mux decode logic 710 outputs the control signals 720A-D such that each of the DMs 725$_{A-D}$ transmit the reference voltage outputted from the upper mux 735. Thus, when the interpolator op amp 730 weights each input by a fourth, which all have the same reference voltage, the result is merely the reference voltage that is outputted by the upper mux 735 which corresponds to selection code "255". A similar process occurs when the received selection code corresponds to a Lower Action except that each DM 725$_{A-D}$ passes to the op am 730 the reference voltage selected by the lower mux 730.

In another example, when the DAC 700 receives the selection code "254" (i.e., an Interp U-L 3/4 Action) the 5 MSBs of the selection code instruct the upper mux 735 to select the reference voltage corresponding to selection code "255" and the lower mux 730 to select the reference voltage corresponding to selection code "251". In turn, the mux control logic 710 controls the DMs 725$_{A-D}$ such that the reference voltage outputted from the upper mux 735 is applied to three of the four inputs of the op amp 730 while the other input is the reference voltage selected by the lower mux 730. Accordingly, when each input is weighted by a fourth and then combined, the result is the reference voltage corresponding to selection code "254". The other Interpolate Actions perform a similar process. For example, an Interp L-U 3/4 Action results in the reference voltage selected by the lower mux 730 being transmitted to three of the four inputs of the op am 730 while the other input is coupled to the reference voltage selected by the upper mux 735. However, the selector signal for the upper mux 735 is decremented when an Interp L-U Action is performed.

Although the table 790 shows a particular order to the selector signals that control the DMs 725$_{A-D}$, these are illustrative only and may be altered. For example, if selection code "253" is received, the selector signals for DMs 725$_{A-B}$ may be high while the selector signals for DMs 725$_{C-D}$ are low. That is, so long as the ratio is maintained (e.g., 3/4, 2/4, 1/4), which DMs 725$_{A-D}$ provide the reference voltage from the muxes 730, 735 is configurable.

In one embodiment, the bus 750 may be further reduced to, e.g., only 32 or 16 wires by using an interpolator circuit 440 with greater number of DMs 725 and an op amp with more inputs. In this case, the DAC may route the selection code such that only 4 or 3 of the MSBs are used as selector signals in the lower and upper muxes while 4 or 5 LSBs are sent to mux decode logic. One of ordinary skill will recognize the other necessary adjusts that could be made to further reduce the width of the bus between the DAC and the reference voltage module. However, reducing the number of wires, and thus, the number of reference voltages received from the module 345 requires the DAC to increase the number of reference voltages that are interpolated. Especially in input devices where the reference voltage schema is non-linear, interpolating more reference voltages may reduce the accuracy of the voltages output from the DACs; however, any loss of accuracy may be compensated by the advantages of reducing the size of the display driver and/or the power requirements.

Further, this disclosure is not limited to only an 8-bit selection code. Similar benefits may be realized using the schematics and algorithms disclosed above in input devices that use selection codes less than or greater than 8 bits.

Figure 8A:
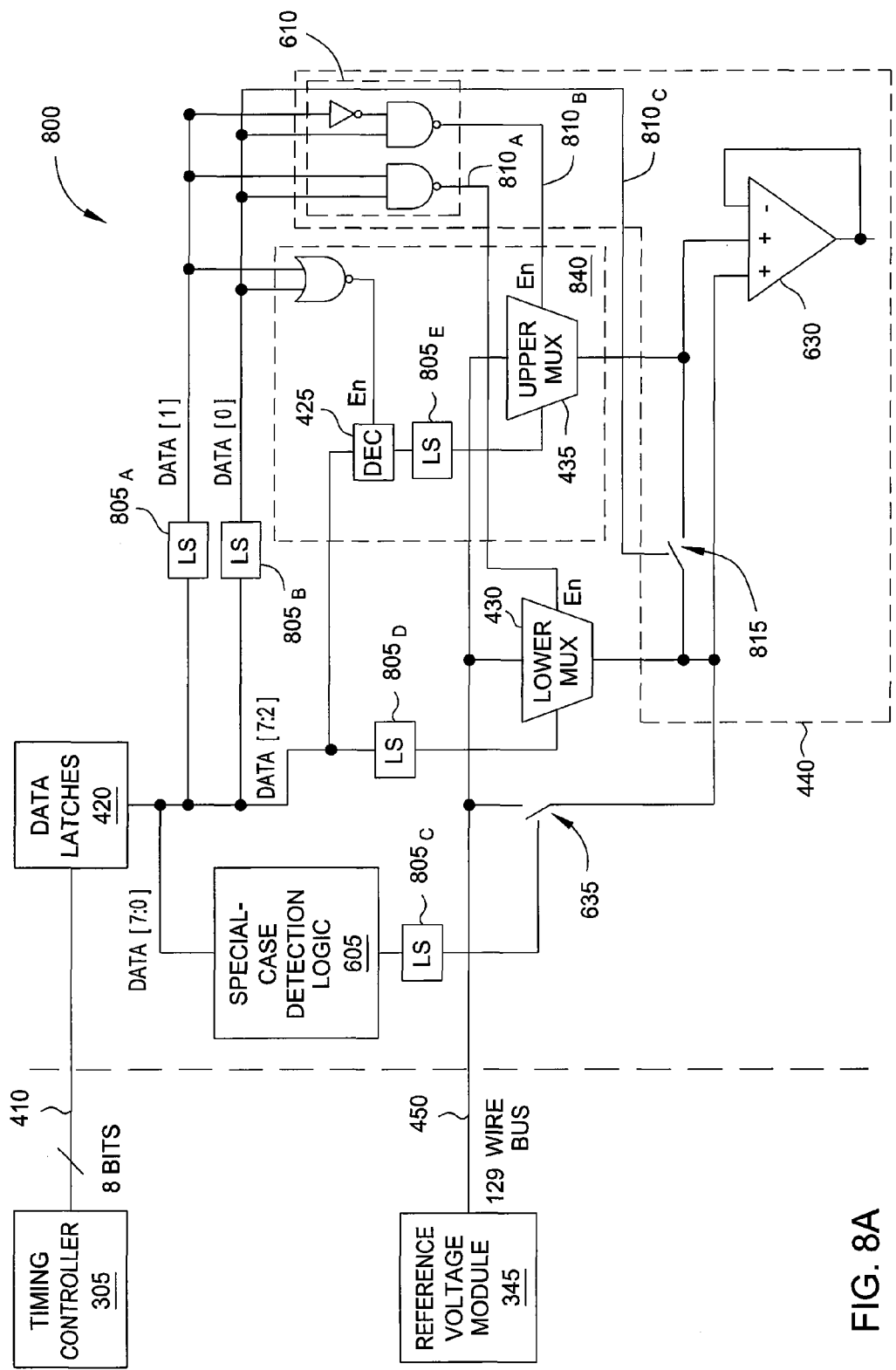

FIGS. 8A-8B illustrate a schematic diagram of a DAC 800 and a corresponding signal table. Specifically, FIG. 8A illustrates one embodiment of the DAC 315 shown in FIG. 6A. The interpolator circuit 440 is shown as including the shorting switch 815, interpolator op amp 630, and the circuitry of the mux decode logic 610. Moreover, the DAC 800 includes various level shifters 805$_{A-E}$ which convert low voltages to high voltages or low voltages into negative voltages. Because the signals making up the selection code may be low voltage signals (0-1.5V), these signals may be insufficient to drive high voltage analog components, for example, the lower and upper muxes 430, 435. When a display inversion schema (e.g., dot inversion) is implemented by the display driver, the level shifters 805$_{A-E}$ in a shadow DAC may change the low voltage signals to a high negative voltage (e.g., approximately −6V).

Each level shifter 805$_{A-E}$ may represent one or more individual level shifter for changing the voltage of a signal on an individual bitline. That is, the number of level shifters corresponds to the number of bitlines; for example, because the 6 MSBs of the selection code are transmitted into level shifter 805$_D$, there are six individual level shifters. One of ordinary skill will recognize that that the schematics shown in FIGS. 6A and 7A may also use level shifters depending on the types of modules and components used in the respective DACs.

In one embodiment, the special-case detection logic 605 may be combined with the logic of either the upper or lower muxes 430, 435. For example, if the special-case scenario occurs when the selection code is "0", then the logic 605 may be incorporated into the mux 430, 435 that is not disabled when selection code "0" is received. In the circuit shown in FIG. 8A, the special-case scenario may be built into either mux 430 or 435 since both are enabled when selection code "0" is received.

Table 850 of FIG. 8B illustrates a portion of the logic and signal values in the DAC 800 based on a received selection code. Specifically, table 850 shows that DAC 800 produces the same output reference voltage as DAC 315 in FIG. 6A when provided with the same selection code. The table 850 includes three different columns from table 650: Lower Mux Enable (L.E.) Column, Upper Mux Enable (U.E.) Column and the Short Column. The enable signal 810$_A$ is represented by the L.E. Column, which, when high, results in the lower mux 430 outputting a reference voltage based on the 6 MSBs of the selection code. The enable signal 810$_B$ is represented by the U.E. Column which determines whether the upper mux 435 outputs a reference voltage from the bus 450. The enable signal 810$_C$ is represented by the Short Column and determines whether the shorting switch 815 is closed (i.e., signal 810$_C$ is high) or open (i.e., signal 810$_C$ is low).

If the DAC 800 receives a selection code corresponding to an Upper Action, the mux decode logic 610 disables the lower mux 430 and enables the upper mux 435 using enable signals 810$_{A-B}$ based on the 2 LSB of the selection code. The mux decode logic 610 also enables the shorting switch 815 which electrically connects the output of the upper mux 435 to both inputs of the interpolator op amp 630. Accordingly, the same reference voltage outputted by the upper mux 435 is outputted from the op amp 630. A similar process occurs during a Lower Action except the upper mux 435 is disabled and the reference voltage selected by the lower mux 430 becomes the output of the DAC 800.

During an Interp U-L or Interp L-U action, the mux decode logic 610 enables both the muxes 430, 435 and ensures that switch 815 is open. Moreover, the NOR gate determines whether the decrementer circuit 425 reduces the 6 MSB selector signal used in the upper mux 435. For example, if the selection code is "252", than the decrementer circuit 425 reduces "111111" to "111110" which results in the upper mux 435 outputting the reference voltage corresponding to the selection code "251". Thus, the reference voltage corresponding to selection code "253" (as provided by the lower mux 430) is transmitted to one input of the interpolator op amp 630 while the reference voltage corresponding to selection code "251" is transmitted to the other. Accordingly, the output of the op amp 630 is the average of the two reference voltages.

Although not shown in table 850, when the selection code corresponding to the special-case detection logic 605 is received by the DAC 800, the special-case detection logic 605 activates the switch 635 which directly couples the interpolator op amp 630 to the corresponding reference voltage on the bus 450. Moreover, the shorting switch 815 may also be controlled by the special-case detection logic 605 which closes the switch 815 to transmit the reference voltage to both inputs of the op amp 630. In another embodiment, the special-case detection logic 605 may include a separate shorting switch for connecting both inputs of the op amp 630 to the reference voltage transmitted directly from the bus 450.

Figures 9A, 9B:
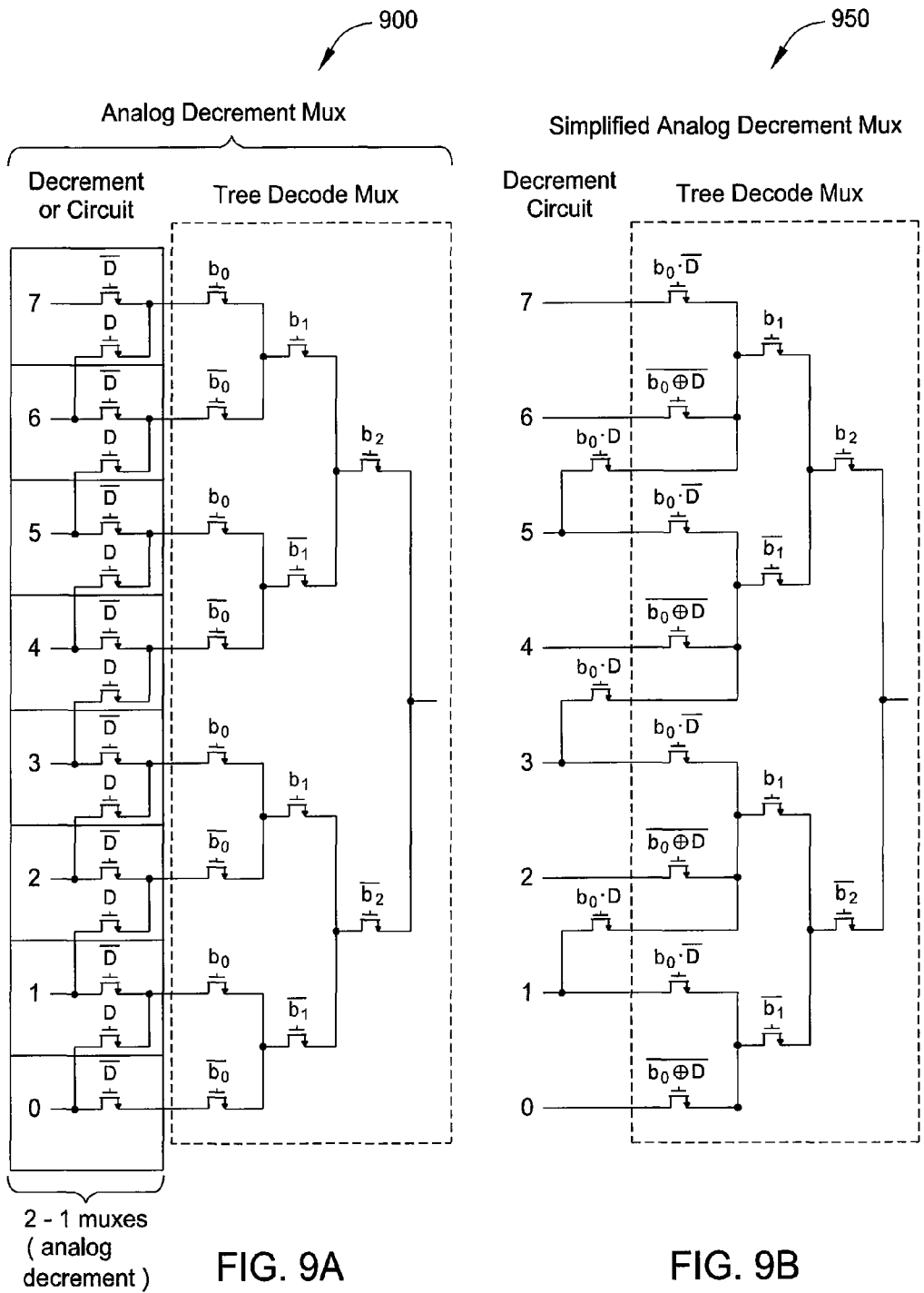
FIGS. 9A-9B illustrate analog circuits for decrementing and decoding a selection code, according to embodiments described herein.

FIGS. 9A-9B illustrate analog circuits for decrementing and decoding a code, according to embodiments described herein. Specifically, FIGS. 9A-9B illustrate analog circuits that can perform the same logic as the components in box 840 of FIG. 8A. That is, the NOR gate, decrementer circuit 425, level shifters 805$_E$, and upper mux 435 may be implemented using the partial layout shown in either the analog decrement mux 900 or the optimized analog decrement mux 950. Note that circuits 900 and 950 only illustrate a portion of the entire circuit that may be needed and show one possible technique for implementing the circuit elements in box 840.

Using an analog decrementer circuit may be advantageous since the level shifters 805$_E$ may be omitted. The level shifters 805$_D$ may instead be used to alter the voltage value of the 6 MSBs of the selection code that are transmitted to both the lower mux 430 and the decrementer circuit 425. For example, the level shifters 805$_D$ may be moved above the node that connects the decrementer circuit 425 to the lower mux 430. Thus, the six level shifters represented by level shifter 805$_E$ may be omitted. This modification may require changing the components of the decrementer circuit 425 from low-voltage components to high-voltage components similar to the components in the upper mux 435. Accordingly, the decrementer circuit (a plurality of 2-1 muxes) 425 may be combined with the tree decode logic of the upper mux 435 to provide the analog decrement mux 900 shown in FIG. 9A.

FIG. 9B illustrates a circuit that performs the same function as the analog decrement mux 900 but is simplified to reduce the layout and complexity of the circuit. That is, the optimized analog decrement mux 950 may use less components than the analog decrement mux 900 thereby saving space in the DAC and display driver.

Figure 10A:
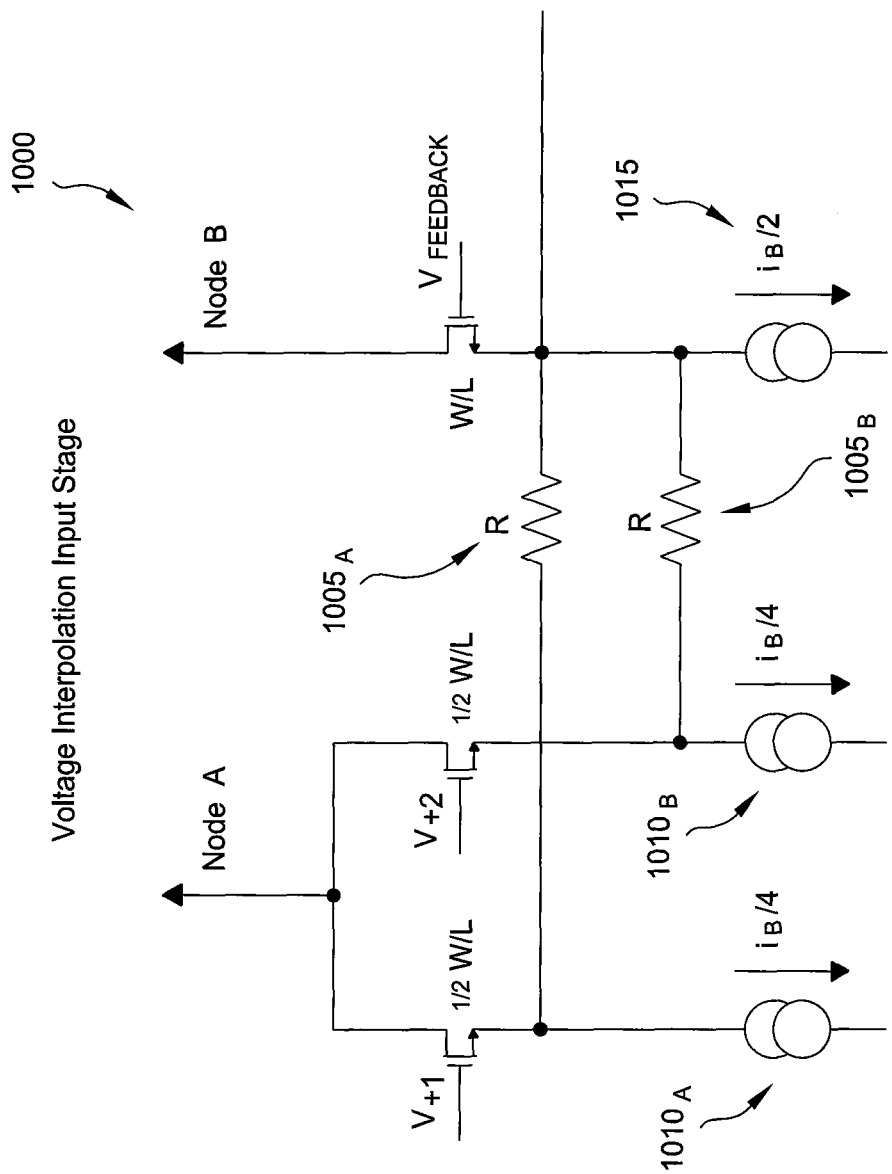
FIGS. 10A-B illustrate circuit schematics of an input stage of an operational amplifier, according to embodiments described herein.
Figure 10B:
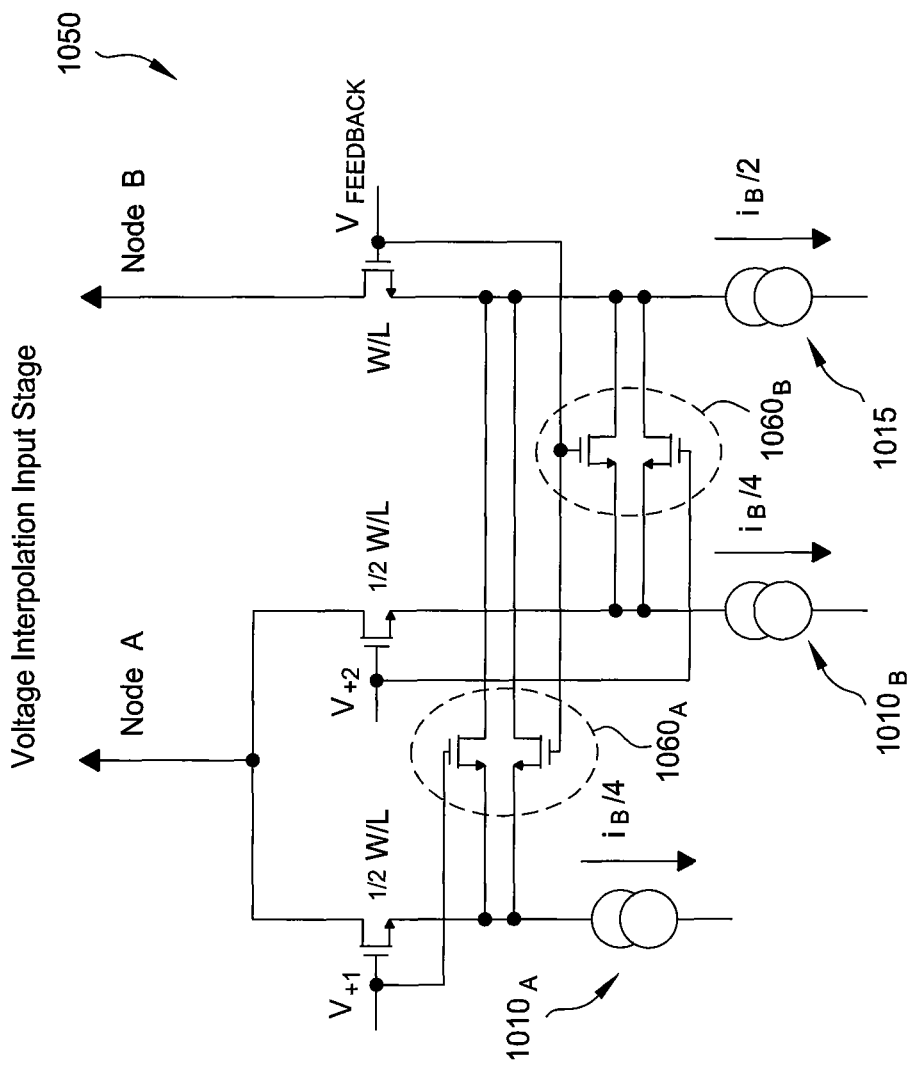

FIGS. 10A-10B illustrate circuit schematics of an input stage of an op amp that performs interpolation, according to embodiments described herein. As shown in FIG. 10A, the input stage 1000 may be, for example, a portion of the interpolator op amp 630 in FIGS. 6A and 8A. Voltages V$_{+1}$ and V$_{+2}$ represent the positive inputs of the interpolating op amp which are interpolated by the op amp. The V$_{FEEDBACK}$ is the input to the feedback loop from the output of the op amp to the negative input as shown in FIG. 6A or 8A.

The input stage 1000 contains current sources 1010$_{A-B}$ and split differential pair devices to perform the interpolation function. Source degeneration is performed by resistive elements 1005$_{A-B}$ which linearize the input stage transconductance and provide accurate current averaging by this interpolating circuit. Moreover, the resistive elements 1005$_{A-B}$, such as transistors, resistors, and the like, couple respective current sources 1010$_{A-B}$ to current source 1015. This provides an advantage over connecting the resistive elements 1005$_{A-B}$ in series between the source of the V$_{+1}$, V$_{+2}$, and V$_{FEEDBACK}$ transistors and the respective current sources 1010$_{A-B}$. The arrangement shown may reduce the voltage drop between the resistive elements 1005$_{A-B}$ and current sources 1010$_{A-B}$ and increase the input voltage range of the circuit. Node A and Node B represent the output of the input stage 1000 which may lead to other stages in the op amp.

FIG. 10B illustrates an alternative input stage 1050 of an op amp that performs interpolation. Specifically, the transistors 1060$_{A-B}$ (i.e., FETs) are used as the resistive elements 1005$_{A-B}$ illustrated in FIG. 10A. As shown, the voltages V$_{+1}$, V$_{+2}$ and $V_{FEEDBACK}$ are used to control the gates of the transistors $1060_{A-B}$, and thus, the resistance between current sources $1010_{A-B}$ and current source 1015, respectively. This method of voltage interpolating at the input stage may be referred to as FET Degeneration.

In one embodiment, the interpolating op amps that use input stages 1000 and 1050 may be zero quiescent amplifiers that draw substantially no power (or current) when the op amps are not operating. That is, the components with the interpolating op amps are chosen such that when the DAC is not outputting reference voltages, the components of the op amps are not drawing power from the voltage rails on the IC chip of the display driver. As used herein, not drawing power means the components of the interpolation op amp does not have active components when the DAC is not outputting reference voltages. Furthermore, the interpolating op amps may be configured such that they do not require additional power beyond that required by a non-interpolating op amp. As a result the interpolating op amps can perform voltage interpolation without requiring additional power.

It is contemplated that the input stages 1000 and 1050 may be expanded or modified to include additional inputs (e.g., $V_{+3}$ and $V_{+4}$ that are received from different selecting circuits) for interpolating reference voltages received at an op amp with more than two inputs—e.g., the op amp 730 of FIG. 7A.

CONCLUSION

A display driver maps a selection code (a digital signal) to a reference voltage which is then used to produce a particular intensity of the radiation emitted from a pixel on a display screen (e.g., a LCD display). This mapping may be performed by one or more DACs in the display driver. However, instead of transmitting all of the different possible reference voltages to the DACs, only a subset of the reference voltages are transmitted. Each DAC may include an interpolator circuit that uses the received reference voltages to interpolate the reference voltages that were not transmitted. In this manner, the display driver may still provide the same number of unique reference voltages to a display screen while transmitting fewer reference voltages along the driver's optical channel.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

We claim:

1. A circuit for providing an output voltage, comprising:
a first selecting circuit configured to output a first voltage selected from a first plurality of input voltages based on a selecting code;
a second selecting circuit configured to output a second voltage selected from a second plurality of input voltages based on the selecting code;
a decrementer circuit coupled to the second selecting circuit, the decrementer circuit configured to receive the selecting code as an input and selectively decrement the selecting code before providing the selecting code to the second selecting circuit; and
an interpolating circuit coupled to respective outputs of the first and second selecting circuits, the interpolating circuit providing the output voltage based on the respective outputs, wherein the output voltage is selected from one of: the first voltage, the second voltage, and an interpolation voltage based on the first and second voltages.

2. The circuit of claim 1, wherein values of the first plurality of input voltages are interleaved with values of the second plurality of input voltages, and wherein each of the values of the first plurality of input voltages are different from each of the values of the second plurality of input voltages.

3. The circuit of claim 1, wherein the interpolation circuitry comprises circuitry to weight the first and second voltages.

4. The circuit of claim 1, wherein the selecting code comprises a most significant bits portion and a least significant bits portion, wherein the decrementer circuit decrements the most significant bits portion before the most significant bits portion of the selecting code is provided to the second selecting circuit.

5. The circuit of claim 1, further comprising decode logic configured to provide at least one control signal to the interpolating circuit for selecting one of: the first voltage, the second voltage, and the interpolation voltage and to provide a different control signal for instructing the decrementer circuit to decrement the selecting code.

6. The circuit of claim 5, wherein the at least one control signal is based on a least significant bit portion of the selecting code.

7. The circuit of claim 5, wherein the decrementer circuit and at least one of the first selecting circuit and second selecting circuit are logically integrated into an optimized analog circuit.

8. The circuit of claim 1, wherein no additional power is required by an amplifier in the interpolating circuit to perform the interpolation relative to power drawn by the amplifier when not used in the interpolating circuit.

9. A circuit for providing an output voltage, comprising:
a first selecting circuit configured to output a first voltage selected from a first plurality of input voltages based on a selecting code;
a second selecting circuit configured to output a second voltage selected from a second plurality of input voltages based on the selecting code;
an analog decrementer circuit configured to selectively decrement the selecting code before the selecting code is provided to the second selecting circuit; an interpolating circuit coupled to respective outputs of the first and second selecting circuits, the interpolating circuit providing the output voltage based on the respective outputs, wherein the output voltage is selected from one of: the first voltage, the second voltage, and an interpolation voltage based on the first and second voltages; and
detect circuitry for identifying a special case, wherein if the special case is identified, the detect circuitry by-passes the first and second selecting circuits such that an output of the detect circuitry is provided to the interpolating circuit, wherein if the special case is not identified, the detect circuitry is electrically disconnected from the interpolating circuit.

10. A method for providing an output voltage, comprising:
using a first selecting circuit to select, based on a selecting code, a first voltage from a first plurality of input voltages;
using a second selecting circuit to select, based on the selecting code, a second voltage from a second plurality of input voltages;
using a decrementer circuit coupled to the second selecting circuit to receive the selecting codes as an input and selectively decrement the selecting code before providing the selecting code to the second selecting circuit; and using an interpolating circuit coupled to respective outputs of the first and second selecting circuits to provide the output voltage, wherein the output voltage is selected from one of: the first voltage, the second voltage, and an interpolation voltage based on the first and second voltages.

11. The method of claim 10, further comprising:
providing at least one control signal to the interpolating circuit for selecting one of: the first voltage, the second voltage, and the interpolation voltage; and
providing a different control signal for instructing the decrementer circuit to selectively decrement the selecting code.

12. The method of claim 11, wherein the at least one control signal is based on a least significant bit portion of the selecting code.

13. The method of claim 11, wherein the decrementer circuit and at least one of the first selecting circuit for selecting the first voltage and the second selecting circuit for selecting the second voltage are logically integrated into an optimized analog circuit.

14. The method of claim 10, wherein values of the first plurality of input voltages are interleaved with values of the second plurality of input voltages, and wherein each of the values of the first plurality of input voltages are different from each of the values of the second plurality of input voltages.

15. A system, comprising:
a display driver, comprising:
a first selecting circuit configured to output a first voltage selected from a first plurality of input voltages based on a selecting code,
a second selecting circuit configured to output a second voltage selected from a second plurality of input voltages based on the selecting code,
a decrementer circuit coupled to the second selecting circuit, the decrementer circuit configured to receive the selecting code as an input and selectively decrement the selecting code before providing the selecting code to the second selecting circuit, and
an interpolating circuit coupled to respective outputs of the first and second selecting circuits, the interpolating circuit providing the output voltage based on the respective outputs, wherein the output voltage is selected from one of: the first voltage, the second voltage, and an interpolation voltage based on the first and second voltages; and
a display screen configured to receive the output voltage.

16. The system of claim 15, wherein the display driver further comprises decode logic configured to provide at least one control signal to the interpolating circuit for selecting one of: the first voltage, the second voltage, and the interpolation voltage and to provide a different control signal for instructing the analog decrementer circuit to decrement the selecting code.

17. The system of claim 16, wherein the at least one control signal is based on a least significant bit portion of the selecting code.

18. The system of claim 16, wherein the decrementer circuit and at least one of a first selecting circuit for selecting the first voltage and a second selecting circuit for selecting the second voltage are logically integrated into an optimized analog circuit.

19. The system of claim 15, wherein values of the first plurality of input voltages are interleaved with values of the second plurality of input voltages, and wherein each of the values of the first plurality of input voltages are different from each of the values of the second plurality of input voltages.

20. The system of claim 15, wherein no additional power is required by an amplifier in the interpolating circuit to perform the interpolation relative to power drawn by the amplifier when not used in the interpolating circuit.

\* \* \* \* \*